United States Patent
Li et al.

(10) Patent No.: US 10,134,678 B2
(45) Date of Patent: Nov. 20, 2018

(54) CHIP-ON-FILM, FLEXIBLE DISPLAY PANEL AND DISPLAY DEVICE

(71) Applicant: BOE Technology Group Co., Ltd., Beijing (CN)

(72) Inventors: Hong Li, Beijing (CN); Liqiang Chen, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/522,202

(22) PCT Filed: Apr. 29, 2016

(86) PCT No.: PCT/CN2016/080682
§ 371 (c)(1),
(2) Date: Apr. 26, 2017

(87) PCT Pub. No.: WO2017/133090
PCT Pub. Date: Aug. 10, 2017

(65) Prior Publication Data
US 2018/0090442 A1  Mar. 29, 2018

(30) Foreign Application Priority Data
Feb. 4, 2016 (CN) .......................... 2016 1 0080878

(51) Int. Cl.
*H01L 23/538* (2006.01)
(52) U.S. Cl.
CPC ...... *H01L 23/5386* (2013.01); *H01L 23/5384* (2013.01); *H01L 23/5387* (2013.01)

(58) Field of Classification Search
CPC ............. H01L 23/5386; H01L 23/5384; H01L 23/5387
See application file for complete search history.

(56) References Cited

U.S. PATENT DOCUMENTS 6,909,488 B2   6/2005   Kurasawa
9,591,754 B2   3/2017   Lee
(Continued)

FOREIGN PATENT DOCUMENTS

CN   1441288 A    9/2003
CN   101034213 A  9/2007
(Continued)

OTHER PUBLICATIONS

First Office Action from Chinese Patent Application No. 201610080878.X, dated Sep. 29, 2017, 16 pages.
(Continued)

*Primary Examiner* — Selim Ahmed
(74) *Attorney, Agent, or Firm* — Westman, Champlin & Koehler, P.A.

(57) ABSTRACT

The present disclosure provides a chip-on-film, a flexible display panel and a display device. The COF includes a plurality of output pads independent of each other. The plurality of output pads are disposed at a side of the substrate and are arranged in at least one row in the first direction. Virtual extension lines of all the output pads intersect at the same intersecting point on the base line. The flexible display panel includes a plurality of input pads independent of each other. The plurality of input pads are disposed in the binding region and are arranged in at least one row in the first direction. Virtual extension lines of all the input pads intersect at the same intersecting point on the base line.

20 Claims, 7 Drawing Sheets (56) References Cited

U.S. PATENT DOCUMENTS

| | | | |
|---|---|---|---|
| 2007/0222777 A1* | 9/2007 | Nakazawa | G02F 1/1345 345/205 |
| 2007/0275578 A1 | 11/2007 | Yamada | |
| 2014/0321088 A1 | 10/2014 | Bae et al. | |
| 2015/0366049 A1* | 12/2015 | Lee | G02F 1/13458 361/749 |

FOREIGN PATENT DOCUMENTS

| | | |
|---|---|---|
| CN | 102890348 A | 1/2013 |
| CN | 104123902 A | 10/2014 |
| CN | 104979316 A | 10/2015 |
| CN | 105301851 A | 2/2016 |
| CN | 105513499 A | 4/2016 |
| CN | 105609007 A | 5/2016 |
| CN | 105720028 A | 6/2016 |
| CN | 205376003 U | 7/2016 |
| CN | 205376004 U | 7/2016 |
| EP | 2811337 A1 | 12/2014 |
| EP | 3093705 A1 | 11/2016 |
| JP | 2007-242942 A | 9/2007 |

OTHER PUBLICATIONS

International Search Report and Written Opinion, including English translation of Box No. V of the Written Opinion, for International Application No. PCT/CN2016/080682, dated Nov. 11, 2016, 12 pages.

* cited by examiner

CHIP-ON-FILM, FLEXIBLE DISPLAY PANEL AND DISPLAY DEVICE

CROSS-REFERENCE TO RELATED APPLICATION

This application is a Section 371 National Stage Application of International Application No. PCT/CN2016/080682, filed on Apr. 29, 2016, entitled "CHIP-ON-FILM, FLEXIBLE DISPLAY PANEL AND DISPLAY DEVICE", which has not yet published, which claims priority to Chinese Application No. 201610080878.X, filed on Feb. 4, 2016, incorporated herein by reference in their entirety.

BACKGROUND OF THE DISCLOSURE

Field of the Disclosure

The present disclosure relates to a technical field of display, more particularly, to a chip-on-film (also abbreviated as COF), a flexible display panel and a display device.

Description of the Related Art

A flexible display technology has become a research hotspot in a field of display technology in recent years. As a flexible display has thin, anti-vibration and lightweight advantages, it has been widely used in civilian areas and military fields. The flexible display may mean that a thin flexible substrate may be used to manufacture a substrate of a display panel. The thin flexible substrate may be bent to have a radius of curvature of only a few centimeters or less without damaging a display function of the display panel.

During manufacturing a flexible display device, the flexible substrate is generally fixed on a glass substrate at first, and subsequent manufacturing processes for the flexible display panel are then performed. Such a process is compatible with existing manufacturing devices of display panel. After the flexible display panel is completely manufactured, the flexible substrate is detached from the glass substrate. A back film is then adhered onto a back surface of the flexible substrate so as to planarize the flexible substrate. Finally, processes such as COF binding or the like are performed.

The flexible display panel which has been detached from the glass substrate is generally very thin, so that a tiny change in size may be easily presented on the flexible display panel under an effect of force during adhering the back film. In the following COF binding process, output pads on the COF are relatively dense and are sensitive to the change in size, so that the change in size of the flexible display panel will lead to a misalignment and a circuit break between pads on the flexible display panel and pads on the COF when the flexible display panel and the COF are bound. As a result, the product yield is adversely affected.

SUMMARY

To this end, embodiments of the present disclosure provide a chip-on-film, a flexible display panel and a display device in order to solve the problems such as a misalignment and a circuit break between pads, which easily occur when the COF is bound onto an existing flexible display panel.

For this purpose, an embodiment of the present disclosure may provide a chip-on-film comprising a substrate, and a plurality of output pads independent of each other. The plurality of output pads are disposed at a side of the substrate and are arranged in at least one row in a first direction, and virtual extension lines of all the output pads are inclined at certain angles with regard to a base line perpendicular to the first direction, respectively, and the virtual extension lines of all the output pads intersect at the same intersecting point on the base line.

According to an optional implementation, in the chip-on-film according to the above embodiment, an angle between the virtual extension line of one output pad in the same one row of output pads and the base line is gradually increased as a distance between the one output pad and the base line is increased.

According to an optional implementation, in the chip-on-film according to the above embodiments, all the output pads are arranged symmetrically with regard to the base line.

According to an optional implementation, in the chip-on-film according to the above embodiments, all the output pads have the same shape.

According to an optional implementation, in the chip-on-film according to the above embodiments, all the output pads have the same occupied area, or a length of each of the output pads in a direction of the base line is equal to one another.

According to an optional implementation, in the chip-on-film according to the above embodiments, the intersecting point is located at a side where overhead tips of the output pads are located.

According to an optional implementation, in the chip-on-film according to the above embodiments, the overhead tips of the output pads have a triangle shape.

According to an optional implementation, in the chip-on-film according to the above embodiments, the output pads comprise a wedge shape, a side-trapezoid shape or a semi-wedge shape.

According to an optional implementation, in the chip-on-film according to the above embodiments, all the output pads are alternately arranged in two rows.

According to an optional implementation, the chip-on-film according to the above embodiments further comprises: a first leading wire disposed on a side of the substrate, a second leading wire disposed on the other side of the substrate, and a chip disposed on the other side of the substrate, wherein, an end of the first leading wire is electrically connected to the chip through a first via-hole extending through the substrate, and the other end of the first leading wire is electrically connected to one row of the output pads, and wherein, an end of the second leading wire is electrically connected to the chip, and the other end of the second leading wire is electrically connected to the other row of the output pads through a second via-hole extending through the substrate.

Correspondingly, an embodiment of the present disclosure may further provide a flexible display panel comprising a flexible display substrate, and a plurality of input pads independent of each other. The plurality of input pads are disposed in a binding region of the flexible display substrate and are arranged in at least one row in a first direction, and virtual extension lines of all the input pads are inclined at certain angles with regard to a base line perpendicular to the first direction, respectively, and the virtual extension lines of all the input pads intersect at the same intersecting point on the base line.

According to an optional implementation, in the flexible display panel according to the above embodiment, an angle between the virtual extension line of one input pad in the same one row of input pads and the base line is gradually increased as a distance between the one input pad and the base line is increased.

According to an optional implementation, in the flexible display panel according to the above embodiments, all the input pads are arranged symmetrically with regard to the base line.

According to an optional implementation, in the flexible display panel according to the above embodiments, all the input pads have the same shape.

According to an optional implementation, in the flexible display panel according to the above embodiments, all the input pads have the same occupied area, or a length of each of the input pads in a direction of the base line is equal to one another.

According to an optional implementation, in the flexible display panel according to the above embodiments, the intersecting point is located at a side where overhead tips of the input pads are located.

According to an optional implementation, in the flexible display panel according to the above embodiments, the overhead tips of the input pads have a triangle shape.

According to an optional implementation, in the flexible display panel according to the above embodiments, the input pads comprise a wedge shape, a side-trapezoid shape or a semi-wedge shape.

Correspondingly, an embodiment of the present disclosure may further provide a display device comprising a chip-on-film according to the above embodiments and/or a flexible display panel according to the above embodiments.

BRIEF DESCRIPTION OF THE DRAWINGS

FIG. 3a~FIG. 3c are schematic structural views of input pads on a flexible display panel according to an embodiment of the present disclosure, respectively;

DETAILED DESCRIPTION OF PREFERRED EMBODIMENTS OF THE DISCLOSURE

Specific implementations of a chip-on-film, a flexible display panel and a display device according to embodiments of the present disclosure will be described in detail below with reference to accompanying drawings.

The shape and size of various parts in the drawings do not reflect the true proportions, and are merely intended to be illustrative of the present disclosure.

Figure 1A:
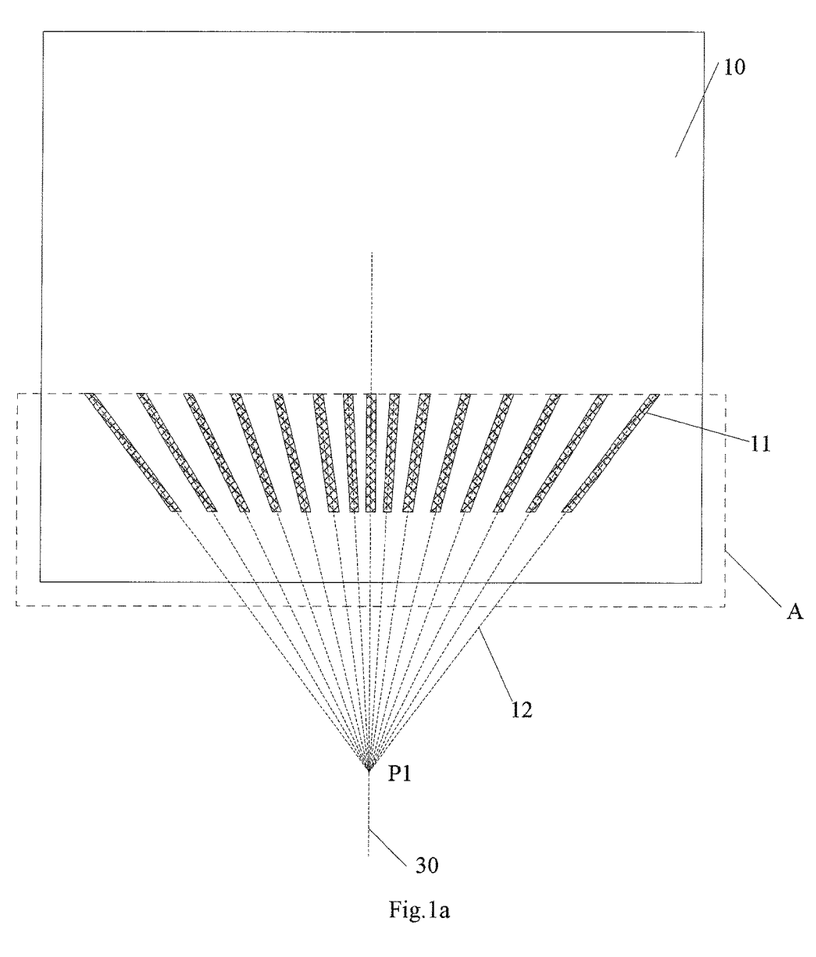
FIG. 1a and FIG. 1b are schematic structural views of a flexible display panel according to an embodiment of the present disclosure, respectively.
Figure 1B:
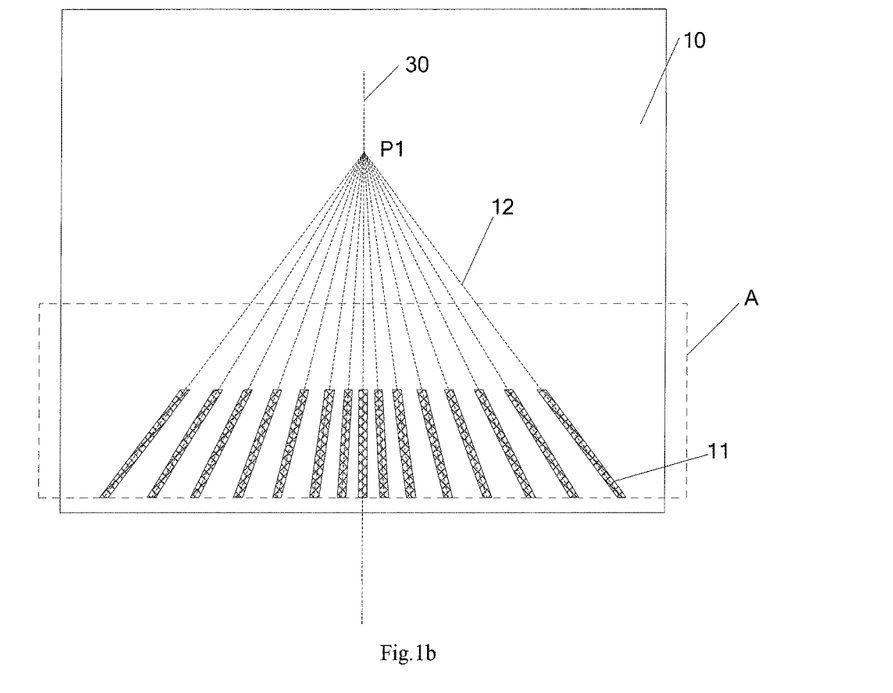

An embodiment of the present disclosure may provide a flexible display panel, as shown in FIG. 1a and FIG. 1b, the flexible display panel may comprise a flexible display substrate 10, and a plurality of input pads 11 independent of each other. The plurality of input pads 11 are disposed in a binding region A of the flexible display substrate 10 and are arranged in at least one row in a first direction (a horizontal direction as shown in FIG. 1a and FIG. 1b).

Virtual extension lines 12 of all the input pads 11 are inclined at certain angles with regard to a base line 30 perpendicular to the first direction, respectively. The virtual extension lines 12 of all the input pads 11 intersect at the same intersecting point P1 on the base line 30.

It is to be noted that the horizontal direction serves as the first direction in FIG. 1a and FIG. 1b. Also, all the input pads 11 may be converged inward as shown in FIG. 1a, that is, the intersecting point P1 is located at a side away from the flexible display panel. Alternatively, all the input pads 11 may be diverged outward as shown in FIG. 1b, that is, the intersecting point P1 is located at a side close to the flexible display panel.

If the size of the flexible display panel according to the above embodiments of the present disclosure is changed in the first direction, as all the input pads 11 are inclined at certain angles with regard to the base line 30, a relative position in a direction perpendicular to the first direction between the flexible display panel and the chip-on-film may be adjusted and the chip-on-film may be then bound onto the flexible display panel when the binding is performed. In this way, in a case that the size in the first direction is changed within a certain range, a correct alignment between the output pads on the chip-on-film and the input pads 11 on the flexible display panel may be realized, so that a binding yield and reliability of the display device may be improved.

In an example, in the flexible display panel according to the above embodiments of the present disclosure, an angle between the virtual extension line 12 of an input pad 11 in the same one row of input pads 11 and the base line 30 is gradually increased as a distance between the input pad 11 and the base line 30 is increased.

In an example, a peripheral region of the flexible display panel is more easily changed in size (i.e. deformed) than a central region thereof when it is subjected to a force, thus the input pads 11 may be arranged on the flexible display panel in such a way that the base line 30 is located at a central axis of the flexible display panel and the input pads 11 are arranged leftward and rightward with regard to the base line 30. In this way, the input pad 11 located further away from the central axis may has a greater inclined angel with regard to the base line 30. Optionally, in the flexible display panel according to the above embodiments of the present disclosure, as shown in FIG. 1a and FIG. 1b, the input pads 11 are arranged symmetrically with regard to the base line 30.

Further, in order to facilitate implementing a manufacturing process, all the input pads 11 may have the same shape in the flexible display panel according to the above embodiments of the present disclosure, as shown in FIG. 1a and FIG. 1b.

Figure 3A:
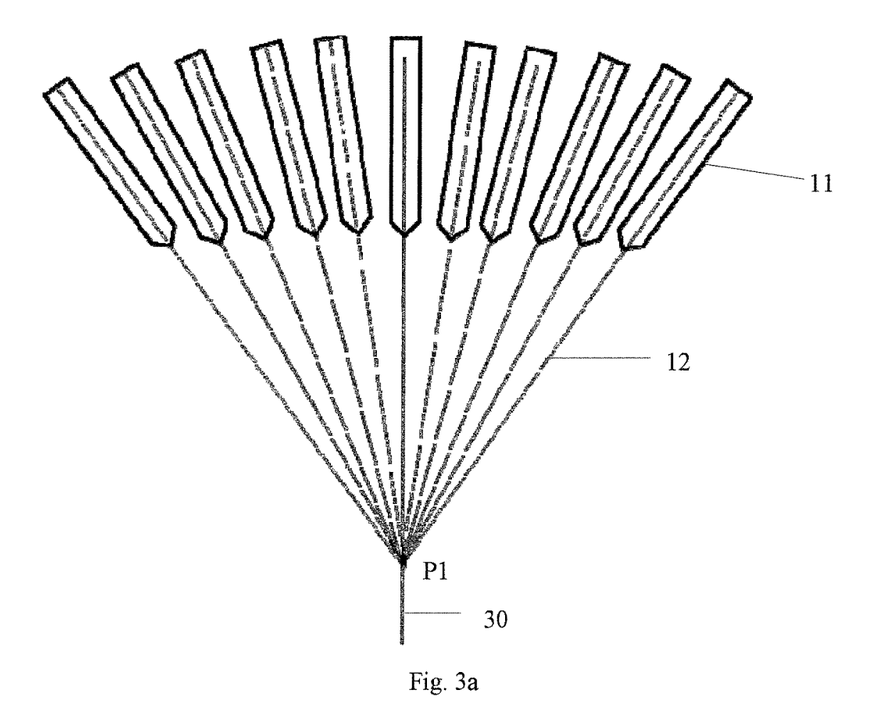
Figure 3B:
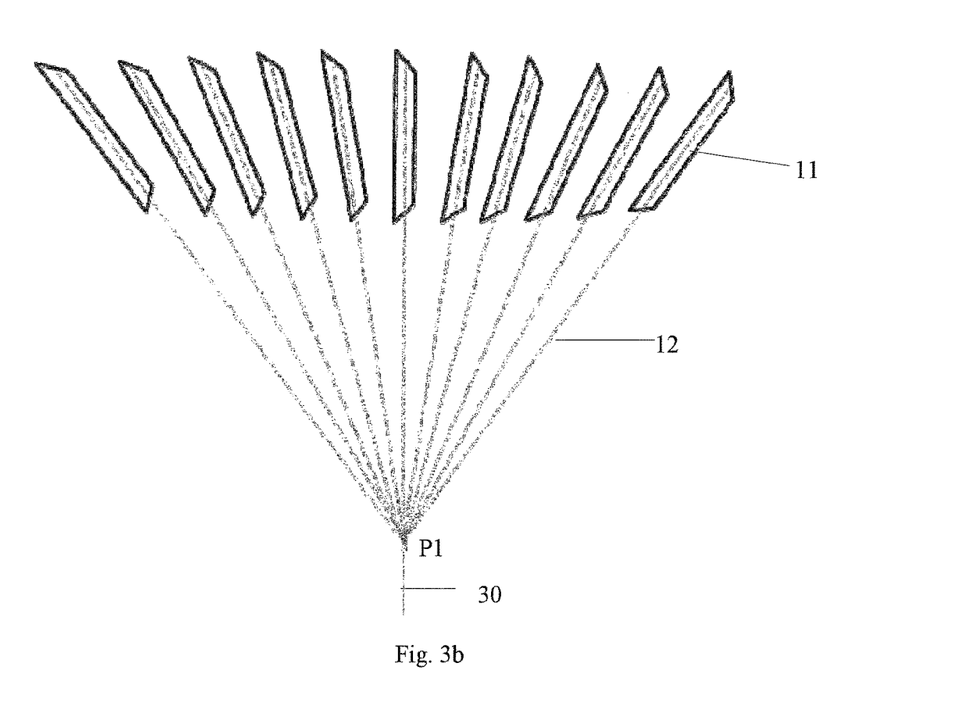
Figure 3C:
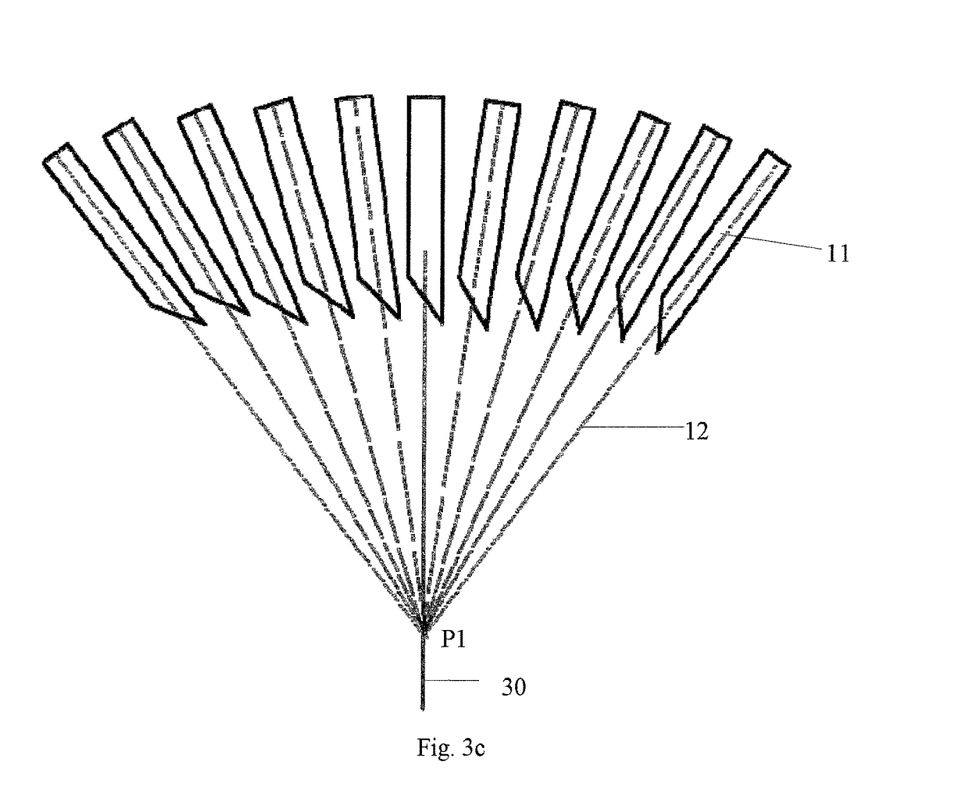

In an example, in the flexible display panel according to the above embodiments of the present disclosure, as shown in FIGS. 3a~3c, all the input pads 11 may have the same occupied area. In other words, all the input pads 11 may have the same shape and the same occupied area. Alternatively, as shown in FIG. 1a and FIG. 1b, a length of each of the input pads in a direction of the base line may be arranged to be equal to one another. The present disclosure is not limited thereto.

Figure 2:
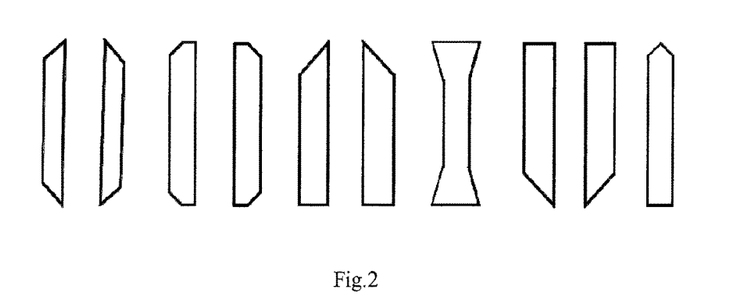
FIG. 2 is a schematic view of shapes of output pads and input pads according to embodiments of the present disclosure.

In an example, in the flexible display panel according to the above embodiments of the present disclosure, the input pads 11 may have various shapes as shown in FIG. 2. The present disclosure is not limited thereto.

Further, in the flexible display panel according to the above embodiments of the present disclosure, as shown in FIG. 3a~3c, the intersecting point P1 of the virtual extension lines 12 of all the input pads 11 is generally located at a side where overhead tips of all the input pads 11 are located, and all the input pads 11 are converged inward. In this way, a gap between two adjacent input pads 11 is relatively small at the side of the overhead tips and a gap between two adjacent input pads 11 is relatively large at a side where fanout lead wires are connected. The overhead tip of each of the input pads 11 is described relative to tips connecting the fanout lead wires.

In an example, the overhead tip of each of the input pads 11 may have a triangle shape, and a portion of the input pad 11 in a compression connection with an output pad on the COF may have a rectangle shape. In this way, the shape of the overhead tip where the gap between two adjacent input pads is relatively small is sharp so as to increase a gap between the two adjacent input pads at the side where the gap is relatively small, thereby effectively avoiding a short circuit from occurring between the two adjacent input pads 11. Also, a portion of the input pad 11 in a compression connection with an output pad on the COF may have a rectangle shape so as to keep an area for the compression connection. In an example, the shapes of the input pads 11 may include a wedge shape as shown in FIG. 3a, or a side-trapezoid shape as shown in FIG. 3b, or a semi-wedge shape as shown in FIG. 3c.

Figure 4A:
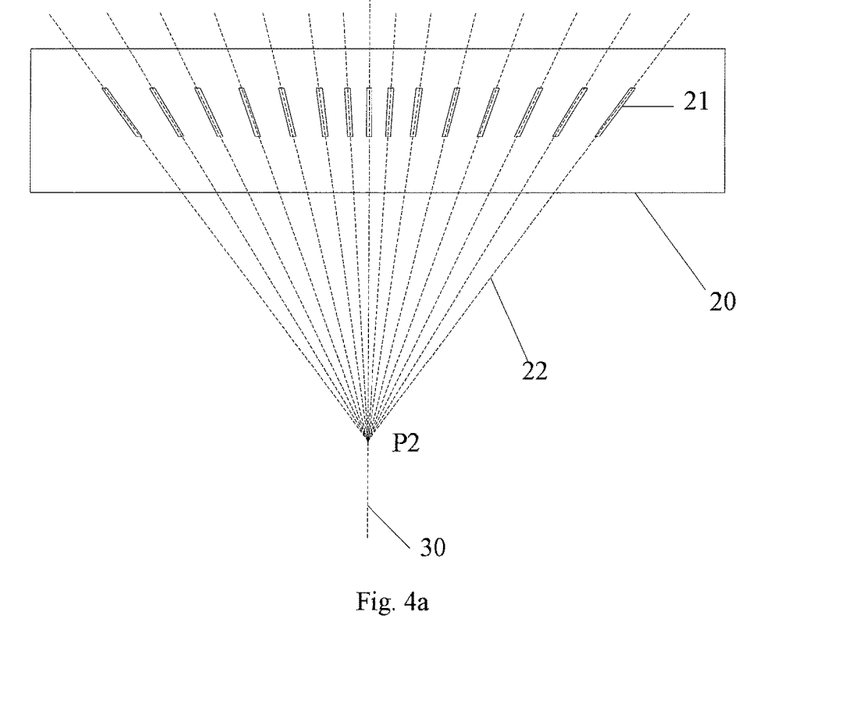
FIG. 4a and FIG. 4b are schematic structural views of a chip-on-film of a display device according to an embodiment of the present disclosure, respectively.

Based on the same concept, an embodiment of the present disclosure may further provide a chip-on-film (COF). As shown in FIG. 4a, the COF may comprise a substrate 20, and a plurality of output pads 21 independent of each other. The plurality of output pads 21 are disposed at a side of the substrate 20 and are arranged in at least one row in the first direction (a horizontal direction as shown in FIG. 4a).

Virtual extension lines 22 of all the output pads 21 are inclined at certain angles with regard to a base line 30 perpendicular to the first direction, respectively. The virtual extension lines 12 of all the output pads 21 intersect at the same intersecting point P2 on the base line 30.

It is to be noted that the horizontal direction serves as the first direction in FIG. 4a. Also, all the output pads 21 may be diverged outward as the corresponding input pads 11 are converged inward. Alternatively, all the output pads 21 may be converged inward as the corresponding input pads 11 are diverged outward.

If the size of the flexible display panel according to the above embodiments of the present disclosure is changed in the first direction, as all the output pads 21 are inclined at certain angles with regard to the base line 30, a relative position in a direction perpendicular to the first direction between the flexible display panel and the chip-on-film may be adjusted and the chip-on-film may be then bound onto the flexible display panel when the binding is performed. In this way, in a case that the size in the first direction is changed within a certain range, a correct alignment between the output pads 21 on the chip-on-film and the input pads 11 on the flexible display panel may be realized, so that a binding yield and reliability of the display device may be improved.

In an example, in the COF according to the above embodiments of the present disclosure, an angle between the virtual extension line 12 of an output pad 21 in the same one row of output pads 21 and the base line 30 is gradually increased as a distance between the output pad 21 and the base line 30 is increased.

In an example, a peripheral region of the flexible display panel is more easily changed in size (i.e. deformed) than a central region thereof when it is subjected to a force, thus the output pads 21 may be arranged on the COF in such a way that the base line 30 is located at a central axis of the COF and the output pads 21 are arranged leftward and rightward with regard to the base line 30. In this way, the output pad 21 located further away from the central axis may has a greater inclined angel with regard to the base line 30.

Optionally, in the COF according to the above embodiments of the present disclosure, as shown in FIG. 4a, the output pads 21 are arranged symmetrically with regard to the base line 30.

Further, in order to facilitate implementing a manufacturing process, all the output pads 21 may have the same shape in the COF according to the above embodiments of the present disclosure, as shown in FIG. 4a.

In an example, similar to the input pad, in the COF according to the above embodiments of the present disclosure, all the output pads 21 may have the same occupied area. In other words, all the output pads 21 may have the same shape and the same size. Alternatively, as shown in FIG. 4a, a length of each of the output pads 21 in a direction of the base line 30 may be arranged to be equal to one another. The present disclosure is not limited thereto.

In an example, in the COF according to the above embodiments of the present disclosure, the output pads 21 may have various shapes as shown in FIG. 2. The present disclosure is not limited thereto.

Further, similar to the input pad, in the COF according to the above embodiments of the present disclosure, the intersecting point P2 of the virtual extension lines 22 of all the output pads 21 is generally located at a side where overhead tips of all the output pads 21 are located. In this way, a gap between two adjacent output pads 21 is relatively small at the side of the overhead tips and a gap between two adjacent output pads 21 is relatively large at a side where the input pads are connected.

In an example, similar to the input pad, the overhead tip of each of the output pads 21 may have a triangle shape, and a portion of the output pad 21 in a compression connection with the input pad on the flexible display panel may have a rectangle shape. In this way, the shape of the overhead tip where the gap between two adjacent output pads is relatively small is sharp so as to increase a gap between the two adjacent output pads at the side where the gap is relatively small, thereby effectively avoiding a short circuit from occurring between the two adjacent output pads 21. Also, a portion of the output pad 21 in a compression connection with the input pad on the flexible display panel may have a rectangle shape so as to keep an area for the compression connection. In an example, the shapes of the output pads 21 may include a wedge shape as shown in FIG. 3a, or a side-trapezoid shape as shown in FIG. 3b, or a semi-wedge shape as shown in FIG. 3c.

Figure 4B:
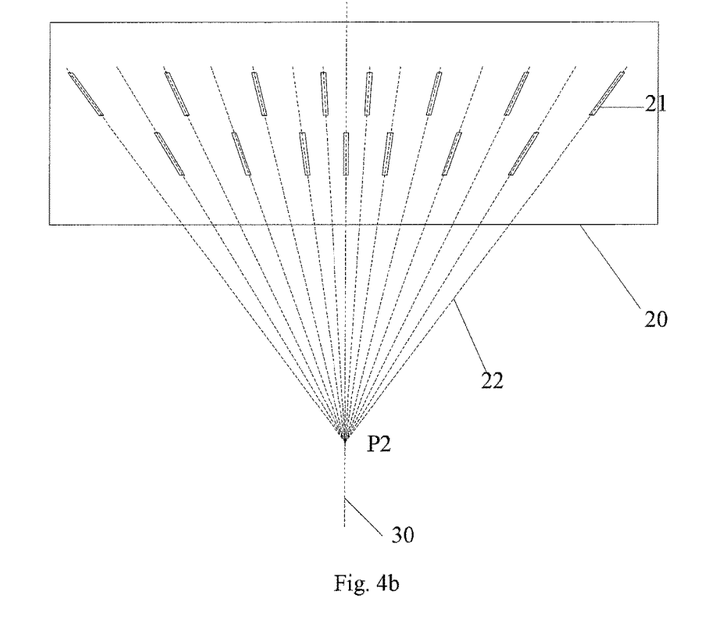

Further, in the COF according to the above embodiments of the present disclosure, all the output pads 21 are generally arranged in two rows on the substrate 20, and the virtual extension lines 22 of the two rows of the output pads 21 are alternately arranged, as shown in FIG. 4b, in order to meet a requirement that the number of signal channels is relatively large in a high-resolution product.

Figure 5:
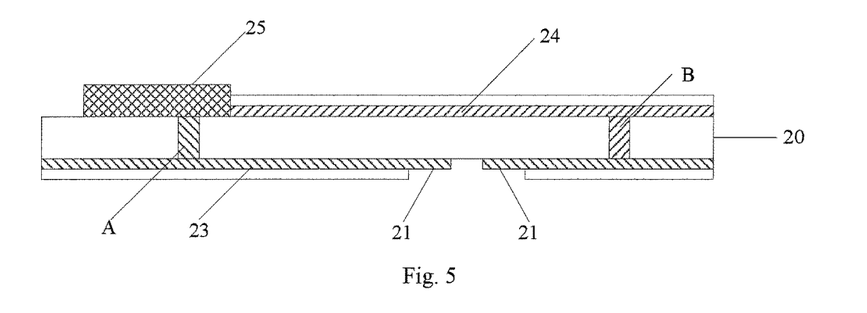
FIG. 5 is a schematic structural side view of a chip-on-film of a display device according to an embodiment of the present disclosure.

In this case, as shown in FIG. 5, the two rows of the output pads 21 are connected to a chip 25 through two layers of metal leading wires on the substrate 20, respectively. In an example, as shown in FIG. 5, the COF may further comprise a first leading wire 23 disposed on a side of the substrate 20, a second leading wire 24 disposed on the other side of the substrate 20, and a chip 25 disposed on the other side of the substrate 20.

In an example, an end of the first leading wire 23 is electrically connected to the chip 25 through a first via-hole A extending through the substrate 20, and the other end of the first leading wire 23 is electrically connected to one row of the output pads 21 (at left side).

In an example, an end of the second leading wire 24 is electrically connected to the chip 25, and the other end of the second leading wire 24 is electrically connected to the other row of the output pads 21 (at right side) through a second via-hole B extending through the substrate 20.

Based on the same concept, an embodiment of the present disclosure may further provide a display device comprising the COF according to the above embodiments of the present disclosure and/or the flexible display panel according to the above embodiments of the present disclosure.

In the COF, the flexible display panel and the display device according to the above embodiments of the present disclosure, the COF may comprise a plurality of output pads independent of each other. The plurality of output pads are disposed at a side of the substrate and are arranged in at least one row in the first direction. Virtual extension lines of all the output pads are inclined at certain angles with regard to a base line perpendicular to the first direction, respectively. The virtual extension lines of all the output pads intersect at the same intersecting point on the base line. The flexible display panel may comprise a plurality of input pads independent of each other. The plurality of input pads are disposed in the binding region and are arranged in at least one row in the first direction. Virtual extension lines of all the input pads are inclined at certain angles with regard to a base line perpendicular to the first direction, respectively. The virtual extension lines of all the input pads intersect at the same intersecting point on the base line. In this way, if the size of the flexible display panel is changed in the first direction, as all the input pads and the output pads are inclined at certain angles with regard to the base line, a relative position in a direction perpendicular to the first direction between the flexible display panel and the COF may be adjusted and the COF may be then bound onto the flexible display panel when the binding is performed. In this way, in a case that the size in the first direction is changed within a certain range, a correct alignment between the output pads on the COF and the input pads on the flexible display panel may be realized, so that a binding yield and reliability of the display device may be improved.

It will be apparent to those skilled in the art that various changes and modifications can be made to the present disclosure without departing from the spirit and scope of the present disclosure. In this way, the present disclosure is intended to include such modifications and variations if the modifications and variations of the present disclosure fall within the scope of the appended claims and equivalents thereof.

The invention claimed is:

1. A chip-on-film comprising:
a substrate, and
a plurality of output pads independent of each other,
wherein, the plurality of output pads are disposed at a side of the substrate and are arranged in at least one row in a first direction, and
wherein, virtual extension lines of all the output pads are inclined at certain angles with regard to a base line perpendicular to the first direction, respectively, and the virtual extension lines of all the output pads intersect at the same intersecting point on the base line,
wherein, the intersecting point is located at a side where overhead tips of the output pads are located,
wherein, the overhead tips of the output pads have a triangle shape.

2. The chip-on-film according to claim 1, wherein, an angle between the virtual extension line of one output pad in the same one row of output pads and the base line is gradually increased as a distance between the one output pad and the base line is increased.

3. The chip-on-film according to claim 1, wherein, all the output pads are arranged symmetrically with regard to the base line.

4. The chip-on-film according to claim 3, wherein, all the output pads have the same shape.

5. The chip-on-film according to claim 4, wherein, all the output pads have the same occupied area, or a length of each of the output pads in a direction of the base line is equal to one another.

6. The chip-on-film according to claim 1, wherein, the output pads comprise a wedge shape, a side-trapezoid shape or a semi-wedge shape.

7. The chip-on-film according to claim 1, wherein, all the output pads are alternately arranged in two rows.

8. The chip-on-film according to claim 7, further comprises: a first leading wire disposed on a side of the substrate, a second leading wire disposed on the other side of the substrate, and a chip disposed on the other side of the substrate,
wherein, an end of the first leading wire is electrically connected to the chip through a first via-hole extending through the substrate, and the other end of the first leading wire is electrically connected to one row of the output pads, and
wherein, an end of the second leading wire is electrically connected to the chip, and the other end of the second leading wire is electrically connected to the other row of the output pads through a second via-hole extending through the substrate.

9. The chip-on-film according to claim 1, wherein, the triangle shape of the overhead tips of the output pads avoids a short circuit from occurring between two adjacent output pads.

10. A flexible display panel comprising:
a flexible display substrate, and
a plurality of input pads independent of each other,
wherein, the plurality of input pads are disposed in a binding region of the flexible display substrate and are arranged in at least one row in a first direction, and
wherein, virtual extension lines of all the input pads are inclined at certain angles with regard to a base line perpendicular to the first direction, respectively, and the virtual extension lines of all the input pads intersect at the same intersecting point on the base line,
wherein, the intersecting point is located at a side where overhead tips of the input pads are located,
wherein, the overhead tips of the input pads have a triangle shape.

11. The flexible display panel according to claim 10, wherein, an angle between the virtual extension line of one input pad in the same one row of input pads and the base line is gradually increased as a distance between the one input pad and the base line is increased.

12. The flexible display panel according to claim 10, wherein, all the input pads are arranged symmetrically with regard to the base line.

13. The flexible display panel according to claim 12, wherein, all the input pads have the same shape.

14. The flexible display panel according to claim 13, wherein, all the input pads have the same occupied area, or a length of each of the input pads in a direction of the base line is equal to one another.

15. The flexible display panel according to claim 10, wherein, the input pads comprise a wedge shape, a side-trapezoid shape or a semi-wedge shape.

16. The flexible display panel according to claim 10, wherein, the triangle shape of the overhead tips of the input pads avoids a short circuit from occurring between two adjacent input pads.

17. A chip-on-film comprising:

a substrate, and a plurality of output pads independent of each other, wherein, the plurality of output pads are disposed at a side of the substrate and are arranged in at least one row in a first direction, wherein, virtual extension lines of all the output pads are inclined at certain angles with regard to a base line perpendicular to the first direction, respectively, and the virtual extension lines of all the output pads intersect at the same intersecting point on the base line, wherein, all the output pads are alternately arranged in two rows, wherein, the chip-on-film further comprises: a first leading wire disposed on a side of the substrate, a second leading wire disposed on the other side of the substrate, and a chip disposed on the other side of the substrate, wherein, an end of the first leading wire is electrically connected to the chip through a first via-hole extending through the substrate, and the other end of the first leading wire is electrically connected to one row of the output pads, wherein, an end of the second leading wire is electrically connected to the chip, and the other end of the second leading wire is electrically connected to the other row of the output pads through a second via-hole extending through the substrate, and wherein, the chip and the two rows of output pads are respectively disposed on different sides of the substrate.

18. The chip-on-film according to claim 17, wherein, the intersecting point is located at a side where overhead tips of the output pads are located.

19. The chip-on-film according to claim 18, wherein, the overhead tips of the output pads have a triangle shape.

20. The chip-on-film according to claim 19, wherein, the output pads comprise a wedge shape, a side-trapezoid shape or a semi-wedge shape.

* * * * *